United States Patent [19]

Patel et al.

[11] 4,321,283

[45] Mar. 23, 1982

[54] NICKEL PLATING METHOD

[75] Inventors: Kirit B. Patel, Tewksbury; Ronald Gonsiorawski, Danvers, both of Mass.

[73] Assignee: Mobil Tyco Solar Energy Corporation, Waltham, Mass.

[21] Appl. No.: 88,396

[22] Filed: Oct. 26, 1979

[51] Int. Cl.³ .................. H01L 21/288; C23C 3/00
[52] U.S. Cl. ................................ 427/74; 427/92; 427/376.3; 427/443.1
[58] Field of Search ............ 427/92, 74, 443.1, 376.3

[56] References Cited

U.S. PATENT DOCUMENTS 3,489,603  1/1970  Darter et al. .................... 427/92
4,152,824  5/1979  Gunsiorawski .................. 29/572

*Primary Examiner*—James R. Hoffman
*Attorney, Agent, or Firm*—Schiller & Pandiscio

[57] ABSTRACT

A simple method for plating nickel onto silicon which renders unnecessary any catalyzing pretreatment of the silicon surface which is to receive the nickel. The method comprises the immersion of a silicon substrate in a suitable nickel bath in order that nickel ions in the bath will be reduced to solid nickel and deposited onto the substrate so as to form an adhering layer thereon. The method is especially advantageous in plating nickel onto silicon shallow junction devices for the purpose of providing ohmic contacts.

40 Claims, 7 Drawing Figures

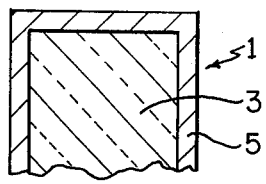
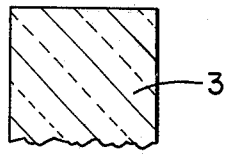
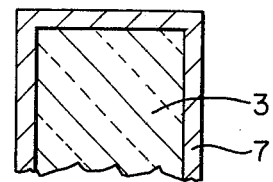
FIG. 1  FIG. 2  FIG. 3
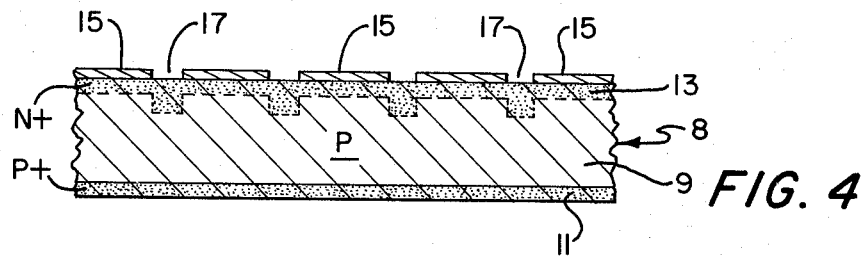
FIG. 4
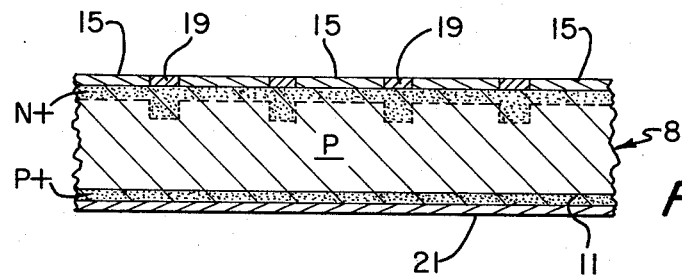
FIG. 5
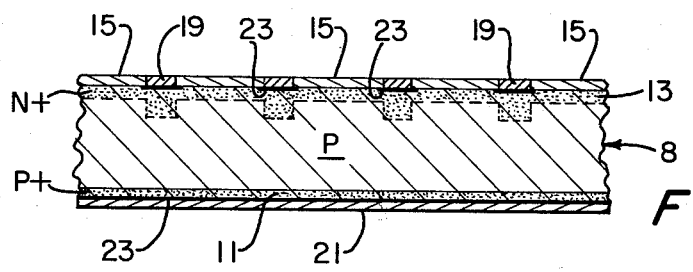
FIG. 6
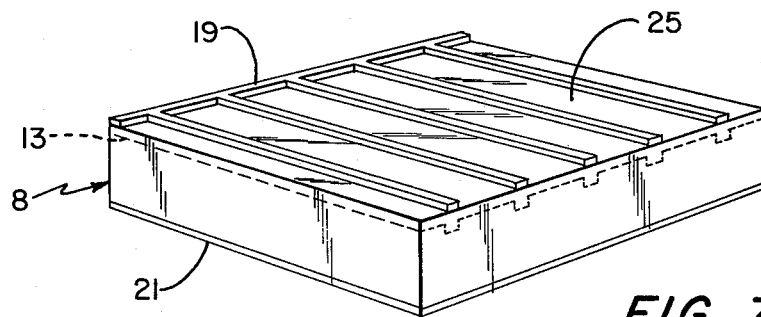
FIG. 7

NICKEL PLATING METHOD

This invention relates to plating techniques in general, and more particularly to methods for plating nickel onto silicon.

BACKGROUND OF THE INVENTION

If is often desirable, in the manufacture of solar cells and other semiconductor devices, to plate nickel directly onto silicon so as to form electrodes or contacts for coupling the semiconductor device into an electric circuit. One of the most well known and effective ways of achieving such plating is through electroless nickel plating.

With such a process, the first step is usually to clean the outer surfaces of the silicon substrate where the nickel is to be deposited so as to remove any particles of dirt or oxide which may be present. This cleaning is desirable since the presence of such substances on the surface of the silicon tends to interfere with proper plating of the nickel onto the silicon. Cleaning may be accomplished in various ways well known to those skilled in the art, e.g. by successively immersing the substrate in suitable baths of hot organic solvents and hot chromic-sulfuric acid, followed with a bath of hydrofluoric acid and rinsing with deionized water. Once this has been done, the surface of the silicon substrate which is to receive the nickel plating is then pretreated with a catalyst. This is necessary since the silicon surface will not itself support the electroless plating process and nickel plated on an untreated silicon surface tends to adhere poorly thereon. Normally palladium is used as the catalyst, although other activators are well known to persons skilled in the art. U.S. Pat. No. 3,489,603 shows one such alternative to the palladium catalyst.

Once the surface of the silicon which is to receive the nickel has been cleaned and pretreated, the silicon is ready for electroless nickel plating. Plating is accomplished by immersing the silicon substrate in a suitable acidic or alkaline bath under appropriate conditions. A typical acidic bath might comprise nickel chloride (at 30 g/l), sodium hypophosphite (at 10 g/l), a third salt of sodium nitrite (at 10 g/l), a pH of between 4 and 6 and a temperature of approximately 190° F. In such a bath the nickel chloride provides the nickel ion which is to be reduced, the hypophosphite provides the reducing agent and the third salt acts as a buffer and complexing agent for the nickel. Alternatively, an alkaline bath may be substituted. Such electroless nickel plating is well known in the art and is described in detail in such publications as *Electroplating and Related Processes* by J. B. Mohler (Chemical Publishing Co., Inc.; New York, 1969), *Surface Preparation and Finishes for Metals* edited by James A. Murphy (McGraw-Hill Book Co.; New York, 1971) and *Handbook of Thin Film Technology* edited by Leon I. Maissel and Reinhard Glang (McGraw-Hill Book Co.; New York, 1970).

Electroless nickel plating of this type suffers from a number of difficulties. First, the need for catalytic pretreatment of the silicon adds an additional step to the plating process. In addition, where the catalyst used is palladium the nickel tends to be plated down in an uneven pattern since the palladium has a tendency to work unevenly over the surface of the silicon. The high cost of palladium is also a negative feature, since significant amounts of palladium may be lost during the pretreatment process.

Furthermore, the chemistry of the electroless plating bath described above tends to result in the formation of some nickel phosphide which may be deposited on the silicon along with the nickel. The inclusion of this nickel phosphide in the plated nickel tends to alter the properties of the deposited nickel and may be quite undesirable depending on the applications contemplated. The phosphorous content in the deposited nickel may be held down by using an alkaline rather than an acidic bath, but the use of an alkaline bath may raise new difficulties. In particular, alkaline baths tend to etch away any aluminum exposed to the bath, thereby complicating plating where the silicon has an aluminum layer thereon. In addition, the use of an alkaline bath tends to promote the formation of an oxide layer on the surface of the silicon so as to impede the plating of nickel directly onto the silicon.

The presence of an oxide layer provides a further complication where it is desired that the deposited nickel serve as an ohmic contact. In such case the nickel layer must be sintered so as to diffuse into the silicon substrate and form a nickel silicide at the nickel/silicon interface. When an intervening oxide layer is present, the sintering must be carried out at a relatively high temperature (above 350° C.) and/or for a relatively long time (40 minutes or more) in order to cause the nickel to penetrate the oxide layer and diffuse into the silicon and form an ohmic contact. However, where the substrate is a shallow junction device such as a solar cell and the nickel layer is on the surface of the substrate nearest the junction, there is a tendency for the nickel to diffuse deep enough to shunt or short out the device, especially where the oxide layer is very thin or non-existent. In this context a shallow junction silicon device is one where the junction is about 1.0 micron or less below the surface on which the nickel is deposited.

As a result, one of the objects of the present invention is to develop a method of plating nickel directly on silicon which does not use the electroless nickel plating process just described. Another object is to provide a plating process which renders unnecessary any catalyzing pretreatment of the silicon surface prior to plating with nickel. Yet another object is to provide a method of achieving strong nickel adherence to the silicon. Still another object is to provide a method of plating nickel directly onto silicon without producing nickel phosphide contaminants. And another object is to provide a plating method utilizing a bath which does not etch away aluminum exposed to the bath. Yet another object is to provide a plating method which does not require the use of expensive palladium. Still another object is to provide a method of making nickel ohmic contacts on silicon devices where the sintering may be carried out at relatively low temperatures (350° C. or less) and within relatively short times (less than 40 minutes). A further object is to provide a simple and reliable method of making nickel ohmic contacts where the reproducibility of high quality contacts is goods or better.

SUMMARY OF THE INVENTION

These and other objects of the present invention are addressed by providing a method for plating nickel on a silicon substrate which essentially comprises immersing the substrate in an aqueous bath of nickel chloride and a selected fluoride compound which ionizes in water, whereby without any pretreatment of the silicon substrate except cleaning, nickel ions in the bath will be reduced to nickel and deposited directly onto the silicon so as to form an adhering layer thereon. Ohmic contacts are formed by sintering the nickel layer. For shallow junction devices, the sintering may be executed below 350° C. and completed in less than 30 minutes. For deep junction devices the sintering may be carried out at the same or higher temperatures and/or for the same or longer times.

BRIEF DESCRIPTION OF THE DRAWINGS

FIGS. 1–3 are cross-sectional views which illustrate various steps in a preferred method of plating nickel onto a silicon substrate using the present invention;

FIGS. 4–6 are cross-sectional views which illustrate various steps in a method of making a solar cell, using the preferred embodiment of the present invention; and FIG. 7 is a perspective view of a completed solar cell formed using the preferred embodiment of the present invention.

DETAILED DESCRIPTION OF THE PREFERRED EMBODIMENT

Referring first to FIG. 1, there is shown a silicon substrate 1 which is to be plated with nickel in accordance with the present invention. Substrate 1 typically comprises a substantially silicon body 3 which may or may not have thereon an outer layer 5 comprised of various particles of dirt and oxides. If body 3 does have a layer 5 on its outer surfaces, it is desirable to remove the layer 5 from those regions where the nickel is to be plated onto the silicon. Selective or complete removal of this exterior layer may be accomplished in ways well known in the art, e.g., complete removal of such a layer may be effected by successively immersing the substrate in baths of hot organic solvents and hot chromic-sulfuric acid, followed by a bath of hydrofluoric acid and a rinsing with deionized water.

Once any unwanted layer 5 has been removed from the silicon body 3 (FIG. 2 shows the silicon body completely devoid of any outer layer 5), the silicon substrate is ready for nickel plating. For this purpose the substrate is immersed in a bath comprised of nickel chloride and a selected fluoride compound which ionizes in water. Such immersion results in nickel ions in the bath (donated by the nickel chloride) being acted on by the selected fluoride compound so as to cause formation of solid nickel by a displacement reaction. It is believed that the displacement reaction is as follows: $Si° + 2Ni^{+2} \rightarrow 2Ni° + Si^{+4}$ with the silicon going into solution as $H_2SiF_6$ and/or $H_2SiO_3$. The nickel thus created is deposited onto the silicon substrate as an exterior layer 7 (FIG. 3). While this ion reduction is occurring, the bath chemistry simultaneously activates the surface of the silicon substrate so that the deposited nickel strongly adheres to the silicon and forms an effective and long-lasting plating thereon. In the case where the plated nickel is to be an ohmic contact, after the nickel has been plated it is subjected to sintering in order to form a suitable nickel silicide.

Preferably, though not necessarily, the selected fluoride compound is ammonium fluoride. Satisfactorily plating may be achieved with baths containing between 10 and 642 g/l of nickel chloride and between 10 and 40 g/l of ammonium fluoride, with a pH of between about 2 and 6. In its preferred embodiment, the aqueous bath comprises nickel chloride (at about 640 g/l) and ammonium fluoride (at about 40 g/l), with a pH level of about 4. In addition, plating using the preferred bath embodiment has been successfully conducted at temperatures as low as 17° C. and as high as 100° C., although a temperature of between 20° and 30° C. is preferred.

Successful plating has also been achieved using such alternative fluoride compounds as hydrofluoric acid and $NH_4F:HF$. In the case of hydrofluoric acid, a suitable bath composition might consist of nickel chloride (at 200–600 g/l) and hydrofluoric acid (at 25–50 mls/l at a pH of 2.6–2.8 and a temperature of 23° C. In the case of $NH_4F:HF$, a suitable bath might comprise nickel chloride (at 300 g/l) and $NH_4F:HF$ (at 20 g/l) at a pH of 3.2 and a temperature of 23° C. Other temperatures between about 17° C. and 100° C. also may be used for such baths.

Nickel deposition rates are generally dependent upon the specific fluoride compound in the bath, pH levels, bath temperature and impurity levels in the silicon. Additionally, the concentrations of the bath components and surface area of the substrate being plated may also affect deposition rates. In general, deposition rates tend to increase as the pH level decreases, and deposition rates generally increase with temperature. Successful plating has been achieved with both P-type and N-type silicon, with plating rates varying according to the type and concentration of dopant used. In general, the deposition rate increases as the impurity concentration in the silicon increases. By way of example, using the preferred bath composition, pH and temperature given above, a nickel layer having a thickness of 2100 Å may be deposited on P-type silicon by immersing the silicon in the bath for 2 minutes. Preferably the nickel layer is deposited with a thickness of between about 500 Å and 2500 Å in the case of shallow junction devices. The same or greater thicknesses may be used for devices with no junction or with deep junctions (i.e. greater than 1 micron). A thickness of about 1500 Å is best preferred for shallow junction devices.

Bath life is inversely related to the rate of deposition. Bath plating capacity is related to concentration levels of the bath chemicals. An eleven liter bath, composed of nickel chloride (at 640 g/l) and ammonium fluoride (at 40 g/l) has plated in excess of 7,000 square inches of silicon to an average depth of 2000 Å without having to regenerate the bath. Regeneration, i.e. the restoration of original concentrations, may be achieved simply by adding more nickel chloride and ammonium fluoride to the bath.

It will be readily apparent to those skilled in the art that the present plating technique is useful in a whole range of semiconductor devices, particularly devices such as solar cells and semiconductor devices which carry a lot of power and require solderable pads, e.g. SCR's. In this respect it will be appreciated that while the formation of a solar cell using the present invention will now be described, the choice of a solar cell as the manufactured product is merely by way of example and not limitation.

FIGS. 4–7 illustrate the formation of a solar cell using the nickel plating method just described. Referring first to FIG. 4, there is shown a semiconductor body 8 formed in accordance with techniques described and shown in U.S. Pat. No. 4,152,824. The body 8 generally comprises a silicon substrate 9 formed of P-type silicon having a thickness of $\geq 2.5 \times 10^{-3}$ cm. A region 11 is formed on the back side of the substrate and comprises the P-type silicon of the substrate additionally doped with P-type dopant so as to comprise a high conductivity P+ region. A region 13 is provided on the front side of the substrate doped with sufficient quantities of N-type dopant so as to comprise a high conductivity N+ region. A top layer 15 formed of silicon dioxide overlies region 13. Layer 15 is perforated at selected spots so as to expose layer 13 as shown. Layer 13 is extended in depth in those locations immediately below apertures 17. Layer 15 is preferably formed with a depth of about 5000 Å, while layer 11 has a depth of $\geq 10,000$ Å. In addition, it is preferred that layer 13 have a depth of $\geq 5000$ Å in those locations immediately below apertures 17 and a depth of $\leq 3500$ Å elsewhere.

Next, the semiconductor body 8 is immersed in a bath of nickel chloride (at 640 g/l) and ammonium fluoride (at 40 g/l) at a temperature of 25° C. and a pH of 4.6 for approximately 1 minute. This results in the adhesive deposition of a nickel layer 19 onto the silicon surfaces 13 adjacent apertures 17 and adhesive deposition of a nickel layer 21 onto the rear surface of the silicon substrate. See FIG. 5. At the same time, however, virtually no nickel is adhesively deposited onto the silicon dioxide layer 15. Nickel layers 19 and 21 are formed of substantially pure nickel and have a depth of approximately 850 Å. In addition, silicon dioxide on the side edge surfaces (not shown) of the silicon body serves to prevent any portions of layer 19 from contacting layer 21 directly, thereby avoiding short-circuiting of the finished solar cell. In FIG. 7, the layer 19 is in the form of a grid so as to leave portions of the solar cell region 13 as shown at 25 which are exposed to receive solar energy.

Plating having been achieved, the semiconductor body 8 is rinsed in deionized water and dried. This serves to remove any loose nickel or salts which may be present on the semiconductor body. Next the body 8 is sintered in a nitrogen or hydrogen atmosphere so as to promote the formation of a nickel silicide layer 23 (FIG. 6) at the junctions of the nickel and silicon regions. Formation of nickel silicide layers 23 is desirable as it ensures that the junctions between the nickel and silicon will form ohmic contacts, rather than the rectifying contacts which can sometimes result when substantially pure nickel is joined directly to substantially pure silicon. Ohmic contacts are required if the nickel is to serve as an electrode or contact. Sintering at temperatures of between 250° C. and 350° C. will promote the formation of $Ni_2Si$, while sintering at temperatures of between 350° C. and 760° C. will promote formation of NiSi. Sintering at temperatures in excess of 760° C. will promote formation of $NiSi_2$. For shallow junction devices it is preferred to use the lowest practical nickel silicide formation temperature because the rate of diffusion of nickel into silicon decreases with decreasing temperature. Furthermore the nickel silicide compound $Ni_2Si$ is generally preferred over the two other silicides since the $Ni_2Si$ tends to use up less silicon per molecule of nickel silicide layer than the other two silicides, thereby reducing the possibility that the N+ silicon region 13 will be completely penetrated by the nickel silicide layer 23 and the solar cell thereby rendered inoperable. For shallow junction devices, sintering is carried out at between 250° C. and 350° C. for between about 15 and 40 minutes. At temperatures in the 250° to 350° C. range, approximately 30 minutes is required to attain a nickel silicide layer of $Ni_2Si$ with a depth of approximately 300 Å, which is preferred for shallow junction devices such as solar cells. For deep junction devices or for devices having no junctions, sintering may be carried out at the same temperatures and for the same times as for shallow junction devices or at substantially greater temperatures and/or for substantially greater times so as to produce one or more of the silicides NiSi and $NiSi_2$ and with or without some $Ni_2Si$ formation.

Once sintering has been accomplished, the semiconductor body 8 is immersed in a dilute (10%) hydrofluoric acid bath to etch away the silicon oxide layer 15 and thereby yield the finished solar cell shown in FIG. 7. This solar cell may then be used in ways well known to persons skilled in the art to produce electricity.

It will readily be appreciated that various modifications and additions to the aforementioned process may be practiced without changing the essence of the present invention. Thus, for example, the semiconductor body illustrated in FIG. 6 (showing the semiconductor body 8 immediately after sintering but prior to removal of the silicon oxide layer 15) may be reimmersed in the nickel plating bath so as to plate additional nickel onto nickel layers 19 and 21. This may be desirable since the sintering process sometimes tends to make the nickel layers 19 and 21 more porous and thereby less suitable as a contact. The deposition of this additional nickel helps improve the contact quality and makes the nickel layers 19 and 21 more receptive to solder or other contact materials.

Another contemplated modification comprises the addition of an aluminum backing to the rear of the solar cell. This aluminum layer may be applied (by vacuum deposition or other well known techniques) either before formation of the layer 11 on the silicon substrate 9 or thereafter. Where application of the aluminum backing occurs before formation of the layer 11, the layer 11 may be created by the aluminum deposition itself since aluminum is a P-type dopant. Once the aluminum layer has been applied, plating takes place as usual and the nickel simply adheres to the aluminum. It should be noted that where the nickel is deposited on aluminum, no sintering of the aluminum-nickel junction will be required to form good ohmic junctions. Thus, in situations where an aluminum backing is used the sintering may be applied only to the front region of the solar cell.

In making solar cells one may also substitute hydrofluoric acid for the ammonium fluoride in the bath. In such a case, the bath may comprise nickel chloride (at 640 g/l) and hydrofluoric acid (at 25 ml/l) at a pH of 2.9 and temperature of 23° C. Such a bath alternative will yield nickel plating onto silicon in substantially the same manner as previously described. However, it should be noted that such a bath composition is not preferred in the manufacture of solar cells since the hydrofluoric acid tends to etch away the silicon oxide layer 15 which is used to mask the nickel deposition. Such etching may result in undesired deposition which could deactivate the cell via short circuiting or lower the cell's efficiency by covering over large portions of the solar collecting portion of the cell. Similar problems may arise in the manufacture of other semiconductor devices which may use a mask of silicon oxides for nickel deposition. In addition, use of hydrofluoric acid in the bath tends to lead to problems in pH control. For these reasons, the substitution of hydrofluoric acid for ammonium fluoride in the bath is not preferred. Should the substitution be preferred for plating a device which has a protective silicon oxide coating on selected portions of one or more surfaces thereof, the device is immersed in the bath long enough for the plating to occur on the unprotected surface areas but not long enough to etch away the protective oxide layer(s).

There are many advantages to using the present invention in place of electroless plating. For one thing, no catalyzing pretreatment is needed to plate nickel onto silicon. In addition, no nickel phosphides are produced along with nickel so as to contaminate the deposited metal. Furthermore, aluminum may be used in the bath without undergoing extensive etching. Additionally, the plating process uses a relatively uncomplicated bath arrangement while yielding excellent results.

A further advantage of the invention is that it reduces the need to form double depth junctions in solar cells due to the reduced risk of the nickel diffusing through to the junction and creating a short circuit. Other advantages and possible modifications will be obvious to persons skilled in the art.

What is claimed is:

1. A method for plating nickel onto a silicon body wherein said method comprises (a) immersing said silicon body into an aqueous bath comprising nickel chloride and ammonium fluoride or ammonium fluoride and hydrofluoric acid, (b) maintaining said silicon body in said bath so that nickel ions in said bath will be converted to solid nickel and deposited onto said silicon body as an adhering layer thereon, and (c) withdrawing said silicon body from said bath.

2. A method according to claim 1 wherein said bath essentially comprises ammonium fluoride and nickel chloride.

3. A method according to claim 2 wherein said bath is comprised of nickel chloride at a concentration of approximately 640 g/l and ammonium fluoride at a concentration of approximately 40 g/l.

4. A method according to claim 3 wherein said bath has a pH of approximately 4.

5. A method according to claim 3 wherein said bath has a temperature of between about 20° C. and 30° C.

6. A method according to claim 2 wherein said silicon body has surface regions which are coated with a silicon oxide and surface regions which are free of silicon oxide, whereby said solid nickel will be adhesively deposited only on those surface regions which are free of silicon oxide.

7. A method according to claim 1 including the subsequent step of sintering said adhering nickel layer so as to create a nickel silicide junction between said silicon body and said adhering nickel layer.

8. A method according to claim 7 wherein sintering takes place in a nitrogen or hydrogen atmosphere.

9. A method according to claim 7 wherein sintering is conducted at temperatures of between 250° and 350° C. so as to promote the formation of $Ni_2Si$.

10. A method according to claim 7 wherein sintering is conducted at temperatures of between 350° and 760° C. so as to promote the formation of NiSi.

11. A method according to claim 7 wherein sintering is conducted at temperatures in excess of 760° C. so as to promote the formation of $NiSi_2$.

12. A method according to claim 7 wherein said silicon body is reimmersed in said bath after sintering is complete in order to adhesively deposit additional nickel onto the nickel layer on said silicon body.

13. A method according to claim 1 wherein said bath comprises ammonium fluoride and hydrofluoric acid.

14. A method according to claim 13 wherein said bath has a pH of approximately 3.2.

15. A method according to claim 13 wherein said bath has a temperature of between about 17° C. and 100° C.

16. A method according to claim 13 wherein prior to immersion said silicon body has surface regions which are coated with silicon oxide and surface regions which are free of silicon oxide, and further wherein immersion is continued long enough for plating to occur on those regions which enter the bath free of silicon oxide but not long enough for the bath to etch away the silicon oxide coating.

17. A method according to claim 1 wherein said bath is comprised of nickel chloride at a concentration of approximately 200–600 g/l and hydrofluoric acid at a concentration of approximately 25–50 g/l.

18. A method according to claim 17 wherein said bath has a temperature of between about 17° C. and 100° C.

19. A method according to claim 17 wherein prior to immersion said silicon body has surface regions which are coated with silicon oxide and surface regions which are free of silicon oxide, and further wherein immersion is continued long enough for plating to occur on those regions which enter the bath free of silicon oxide but not long enough for the bath to etch away the silicon oxide coating.

20. A method according to claim 19 wherein said bath has a temperature of approximately 23° C.

21. A method of making a photovoltaic semiconductor solar cell comprising:
    (1) forming a silicon semiconductor body of a first conductivity type having a top region of a second conductivity type, said top region being characterized by first surface regions which are coated with silicon oxide and second surface regions which are free of silicon oxide, said second surface regions forming a grid pattern on said top region;
    (2) immersing said semiconductor body in an aqueous bath of nickel chloride and a fluoride compound which ionizes in water,
    (3) maintaining said semiconductor body in said bath long enough for a layer of nickel to be adhesively deposited on those second surface regions;
    (4) withdrawing said semiconductor body from said bath;
    (5) washing said semiconductor body with deionized water so as to remove any loose particles from said semiconductor body;
    (6) sintering said adhering nickel layer so as to create a nickel silicide junction between said silicon body and said adhering nickel layer; and
    (7) removing said silicon oxide from said first surface regions of said semiconductor body.

22. A method according to claim 21 wherein said fluoride compound is ammonium fluoride.

23. A method according to claim 22 wherein said bath is comprised of nickel chloride at a concentration of approximately 640 g/l and ammonium fluoride at a concentration of approximately 40 g/l.

24. A method according to claim 22 wherein said bath has a pH of approximately 4.5.

25. A method according to claim 22 wherein said bath has a temperature of approximately 23° C.

26. A method according to claim 21 wherein said top region has a depth of approximately 5000 Å.

27. A method according to claim 21 wherein said body is immersed in said bath long enough for a layer of nickel approximately 1500 Å thick to be formed.

28. A method according to claim 21 wherein sintering is conducted at a temperature of approximately 250° C. to 350° C. and for a period of time sufficient to create a nickel silicide junction but not so long as to cause said top region to be penetrated through to said silicon substrate.

29. A method according to claim 21 wherein said semiconductor body is reimmersed in said bath after sintering so as to deposit additional nickel onto the nickel layer on said semiconductor body.

30. A method according to claim 21 wherein said aqueous bath comprises hydrofluoric acid.

31. A method according to claim 21 wherein said aqueous bath comprises ammonium fluoride and hydrofluoric acid.

32. A method for forming an ohmic nickel contact on a silicon body comprising the steps of: (a) immersing said silicon body into an aqueous bath of nickel chloride and a fluoride compound that ionizes in water, (b) maintaining said silicon body in said bath so that nickel ions in said bath will be converted to solid nickel and deposited onto said silicon body as an adhering layer thereon, (c) withdrawing said silicon body from said bath, and (d) sintering said adhering layer so as to produce a nickel silicide at the junction of said silicon body and said adhering layer of nickel.

33. A method according to claim 32 further including the step of rinsing said silicon body after it is removed from said bath and before said adhering layer is sintered.

34. A method according to claim 32 further including the step of plating additional nickel onto the sintered nickel layer.

35. A method according to claim 34 wherein said additional nickel is plated onto said sintered nickel layer by immersing said sintered nickel layer into an aqueous bath of nickel chloride and a fluoride compound that ionizes in water.

36. A method according to claim 35 wherein said fluoride compound is ammonium fluoride.

37. A method according to claim 36 wherein said bath is comprised of nickel chloride at a concentration of between 10 and 640 g/l and ammonium fluoride at a concentration of between 10 and 40 g/l.

38. A method according to claim 37 wherein said bath has a pH of between 2 and 6 and a temperature between 17° C. and 100° C.

39. A method according to claim 38 wherein said silicon body is maintained in said bath until the nickel layer has a thickness of between about 500 and 2500 Angstroms.

40. A method for plating nickel onto a silicon body wherein said method comprises (a) immersing said silicon body into an aqueous bath of nickel chloride and hydrofluoric acid with a pH of 2.6–2.8, (b) maintaining said silicon body in said bath so that nickel ions in said bath will be converted to solid nickel and deposited onto said silicon body as an adhering layer thereon, and (c) withdrawing said silicon body from said bath after said layer has reached a thickness of between about 500 and 2500 Angstroms.

* * * * *